(12) United States Patent
Hiroshige et al.

(10) Patent No.: US 6,228,500 B1
(45) Date of Patent: May 8, 2001

(54) ADHESIVE COMPOSITION AND PRECURSOR THEREOF

(75) Inventors: Yuji Hiroshige; Kohichiro Kawate, both of Tokyo (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/341,806

(22) PCT Filed: Mar. 8, 1999

(86) PCT No.: PCT/US99/05017

§ 371 Date: Jul. 19, 1999

§ 102(e) Date: Jul. 19, 1999

(51) Int. Cl.$^7$ .................................................. B32B 15/08
(52) U.S. Cl. ...................... 428/418; 523/460; 361/748; 361/750
(58) Field of Search ............................. 523/460; 428/418; 361/748, 750

(56) References Cited

U.S. PATENT DOCUMENTS

| | | |
|---|---|---|
| 4,282,136 | 8/1981 | Hunt et al. . |
| 5,073,605 | 12/1991 | Hallgren et al. . |
| 5,258,434 | 11/1993 | Hanabusa . |

FOREIGN PATENT DOCUMENTS

| | | |
|---|---|---|
| 0 763 567 | 3/1997 | (EP) . |
| 60-130666 | 7/1985 | (JP) . |
| 61-43550 | 3/1986 | (JP) . |
| 62-274690 | 11/1987 | (JP) . |
| 1-135844 | 5/1989 | (JP) . |
| 2-145676 | 6/1990 | (JP) . |
| 3-6280 | 1/1991 | (JP) . |
| 5-5085 | 1/1993 | (JP) . |
| 9-125037 | 5/1997 | (JP) . |
| 9-132710 | 5/1997 | (JP) . |

OTHER PUBLICATIONS

Chemical Abstracts, vol. 114, No. 4, Jan. 28, 1991, Columbus, Ohio, US; abstract No. 25457, Takagi, M.E.A.: "Epoxy Resin Adhesives for Printed Circuit Boards," XP002109297 abstract; and JP 02 001789 A (Matsushita Electric Works), Jan. 8. 1990.

Primary Examiner—Robert Dawson
Assistant Examiner—D. Aylward

(57) ABSTRACT

An adhesive composition, which is useful as an adhesive for FPC protective film and is particularly superior in dimensional stability and adhesion is described herein. The adhesive composition comprises a resin component containing an phenoxy resin, an epoxy resin and a curing agent, characterized in that said resin component further contains a polyester polyol and an inorganic colloid dispersed in said resin component.

19 Claims, No Drawings

ADHESIVE COMPOSITION AND PRECURSOR THEREOF

FIELD OF THE INVENTION

The present invention relates to an adhesive composition comprising, as a base, a resin component containing a phenoxy resin, an epoxy resin and a curing agent, and an adhesive composition precursor as a raw material of such a composition.

BACKGROUND OF THE INVENTION

As a material of an adhesive film for FPC (flexible printed circuit board) protective film, various adhesive compositions obtained by combination of thermoplastic resins and epoxy resins as thermosetting resins have hitherto been known (see, for example, Japanese Unexamined Patent Publication (Kokai) Nos. 9-132710, 9-125037, 5-5085, 3-6280, 2-145676, 62-274690, 60-130666, 1-135844 and 61-43550).

Among adhesive films disclosed in the above-described patent publications, an adhesive film formed from a composition containing a phenoxy resin, an epoxy resin and a curing agent is comparatively superior in performances such as heat resistance, adhesion to metal parts, etc. and, therefore, the adhesive film has hitherto been considered to be useful. It is also disclosed to use a polyester resin or various elastomers in place of a phenoxy resin, as the thermoplastic resin. Furthermore, dicyanamide is often used, comparatively, because it is particularly superior in potentiality.

However, the above-described adhesive composition containing a phenoxy resin, an epoxy resin and dicyandiamide as a curing agent, as a main component, has a drawback in that a dimensional change caused by a stress produced during the thermal curing process is comparatively large. Reduction in such a dimensional change, i.e. improvement of the dimensional stability, is further required in the usage of the adhesive for FPC protective film. In the above-described conventional composition, however, it was very difficult to respond to such a requirement.

On the other hand, it has been known as a conventional technique to improve the nonflammability of the resin composition by adding a combination of a brominated epoxy resin and antimony pentaoxide in the general field of the resin composition. This technique is normally characterized by mixing antimony pentaoxide powder with a resin component to form a nonflammable composition. Since the antimony pentaoxide powder is comparatively inexpensive, its utilization value is high. However, since an average particle diameter of the antimony pentaoxide powder is normally not less than 0.5 $\mu$m, sedimentation of the powder is liable to arise due to gravity and it was difficult to obtain a composition in the state where the respective components are uniformly dispersed. That is, in case of forming an adhesive composition containing the antimony pentaoxide powder, sedimentation of the antimony pentaoxide powder is liable to arise in a mixed solution of an active amount of the antimony pentaoxide, a resin component and a solvent. Therefore, it was difficult to realize the state (structure) where the respective components are uniformly mixed. Such a nonuniform structure causes deterioration of the adhesion, which results in drastic deterioration of the performance as the adhesive for FPC protective film.

SUMMARY OF THE INVENTION

The object of the present invention is, therefore, to solve the above-described problems of the prior art and to provide an adhesive composition comprising a phenoxy resin, an epoxy resin and a curing agent, which is superior in performance as an adhesive for FPC protective film, particularly dimensional stability and adhesion.

A further object of the present invention is to provide an adhesive composition precursor suited to provide such an adhesive composition.

DETAILED DESCRIPTION OF THE INVENTION

According to one aspect of the present invention, there is provided an adhesive composition comprising a resin component containing a phenoxy resin, an epoxy resin and a curing agent, characterized in that said resin component further contains a polyester polyol and further comprises an inorganic colloid dispersed in said resin component.

According to another aspect of the present invention, there is provided an adhesive composition precursor capable of affording said adhesive composition after drying, characterized in that said precursor comprises:

(i) said resin component, and (ii) an inorganic particle sol containing a dispersion medium and said inorganic colloid dispersed in said dispersion medium.

Subsequently, the present invention will be described with reference to the preferred embodiments thereof. For further understanding of the present invention, the present invention will be described first by way of the operation aspect as follows.

The adhesive composition of the present invention is a composition comprising, as a base, a resin component containing a phenoxy resin, an epoxy resin and a curing agent, characterized in that said resin component further contains a polyester polyol (hereinafter, sometimes, referred to as a "polyol") and an inorganic colloid in a predetermined ratio. According to the adhesive composition of the present invention, by using the resin component having such a specific composition, the dimensional stability, particularly dimensional stability after a heat treatment (for the purpose of completion of curing) performed furthermore after heat bonding can be efficiently enhanced. In fact, according to the present invention, such a dimensional stability (represented by a dimensional change (%), a measuring method of which is described hereinafter) can be reduced to 0.1% or less. In case of using such an adhesive composition in adhesion between a metal such as copper foil, etc. and a polymer such as polyimide, etc., it is also possible to efficiently increase the adhesive force. For example, a peel adhesive force (which means a "180° peel adhesive force" hereinafter unless otherwise stated) can be increased to 700 g/cm or more.

The operation of the above polyol to be contained in the resin component lies in improvement in interfacial adhesive force between the adhesive composition and adherend, first, because the polyol has two or more hydroxyl groups in the molecule. When a cured article of the adhesive composition contains a polyol, the flexibility of the cured article is improved and the peel adhesive force is increased. Furthermore, since the polyol can efficiently increase the crosslink density of the cured article without deteriorating the flexibility of the cured article, it also contributes to the improvement in dimensional stability.

The content of the above polyol is not specifically limited as far as the effect of the present invention is not adversely affected, but is normally within the range from 0.5 to 20% by weight based on the total amount of the adhesive composition. When the content of the polyol is less than 0.5% by weight, the peel adhesive force and dimensional stability are likely to be lowered. On the other hand when the content exceeds 20% by weight, other performances of the adhesive composition (e.g. nonflammability described hereinafter) are likely to be lowered. From such a point of view, the preferable content of the polyol is within the range from 1 to 15% by weight based on the total amount of the adhesive composition.

The term "polyol", i.e. "polyester polyol" used herein means a compound which contains one or more ester bonds and two or more hydroxyl groups in the molecule and has a number-average molecular weight of 100 to 18,000, suitably 200 to 10,000, particularly suitably 300 to 6,000. The number-average molecular weight less than 100 causes a problem that, after heat treatment (thermal curing), an effectively increased dimensional stability may not be obtained, and the molecular weight above 18,000 may cause a reduction of the adhesive force. As the polyol, for example, caprolactonepolyol is suitable because of its good compatibility with other resin components such as phenoxy resin, epoxy resin, etc. It is preferable that the kind and addition amount of the polyol are selected to impart high dynamic bending resistance to the cured article of the adhesive composition without reducing the elasticity at the temperature of not less than 60° C. For example, it is preferable to select the kind and addition amount of the polyol so that the glass transition temperature (Tg) of the adhesive composition does not become 70° C. or less.

On the other hand, since the inorganic colloid used in combination with the polyol is normally contained in the dispersion in the form of colloidal particles, sedimentation of the colloidal particles does not arise due to gravity and the colloidal particles can be stably dispersed. Accordingly, in the adhesive composition formed by drying such a dispersion of the present invention, the respective components can be uniformly dispersed, and peel adhesive force and dimensional stability of the composition can be efficiently improved.

In common with the above polyol, the content of inorganic colloid is not specifically limited as far as the effect of the present invention is not adversely affected, but is normally within the range from 1 to 50% by weight based on the total amount of the adhesive composition. When the content of the inorganic colloid is less than 1% by weight, the dimensional stability is likely to be lowered. On the other hand when the content exceeds 50% by weight, the peel adhesive force is likely to be lowered. From such a point of view, the preferable content of the inorganic colloid is within the range from 2 to 45% by weight based on the total amount of the adhesive composition.

The term "inorganic colloid" used herein normally means fine particles of the inorganic colloid having an average particle diameter within the range from 1 to 100 nm. An inorganic colloid, for example those obtained by mixing an inorganic particle sol with a resin component to disperse the inorganic particle sol into the resin component, is suitable. The inorganic particle sol is a mixture of (i) a dispersion medium and (ii) an inorganic colloid dispersed in the dispersion medium. As such an inorganic particle sol, there can be used antimony pentaoxide sol, silica sol, etc.

In accordance with one preferred embodiment of the present invention, the adhesive composition of the present invention is an adhesive composition, wherein the above epoxy resin contains a brominated epoxy resin and the above inorganic colloid is a colloid of antimony pentaoxide and, furthermore, the total proportion of the brominated epoxy resin and the colloid of antimony pentaoxide is within the range from 13 to 60% by weight based on the total amount of the adhesive composition. Such an adhesive composition can show the nonflammability of the level VO or higher when the nonflammability is evaluated by the level of the nonflammability defined by the standard UL-94. In other words, the adhesive composition can have the nonflammability enough to satisfy the standard VO. With respect to the amount of the brominated epoxy resin and antimony pentaoxide particles used, when the total proportion of them is less than 13% by weight based on the total amount of the adhesive composition, it is impossible to satisfy the above standard VO. On the other hand, when it exceeds 60% by weight, the peel adhesive force is lowered.

The term "brominated epoxy resin" used herein means an epoxy resin obtained by introducing a bromine atom into the molecule, for example, those having a structure wherein one or more hydrogen atoms of the benzene ring in the molecule of a bisphenol type epoxy resin are substituted with bromine atoms. In the specification of the present application, the epoxy resin other than this "brominated epoxy resin" is referred to as a "non-brominated epoxy resin" to define it by distinguishing from the brominated epoxy resin.

The term "resin component" in the adhesive composition of the present invention means a mixture of a phenoxy resin, an epoxy resin, a curing agent, and a polyol. An optionally contained additional component, a solvent, and an inorganic colloid are not contained in the resin component. Examples of the optionally contained additional component include (i) a thermoplastic polymer such as an acrylic elastomer, etc., and additives such as (ii) a curing accelerator and (iii) a tackifier, a plasticizer, an antioxidant, a pigment, a dye, a filler other than an inorganic colloid, etc.

The content of the resin component, other than the polyol, contained in the adhesive composition, is not also limited specifically as far as the effect of the present invention is not adversely affected. For example, in a preferred embodiment, the contents of the (a) phenoxy resin, (b) non-brominated epoxy resin, (c) brominated epoxy resin and (d) curing agent are as follows:

(a) phenoxy resin: 40 to 95% by weight, suitably 50 to 90% by weight, (b) non-brominated epoxy resin: 4 to 40% by weight, suitably 5 to 35% by weight, (c) brominated epoxy resin: 4 to 50% by weight, suitably 5 to 40% by weight, and (d) curing agent: 0.1 to 7% by weight, suitably 0.5 to 5% by weight, based on the total amount of the resin component.

When these components respectively within the ranges defined above, it is possible to easily realize a state where the respective components are uniformly dispersed in an adhesive composition (after drying) formed by using a precursor composition containing the above resin component and a solvent (e.g. methyl ethyl ketone, methanol, ethyl alcohol, etc.).

The term "curing agent" used herein means a compound capable of reacting with at least epoxy resin in the curing reaction or crosslinking reaction, such as dicyandiamide or a derivative thereof. Dicyandiamides and derivatives thereof are superior in potentiality and can efficiently enhance the storage stability of the composition and precursor.

An adhesive composition of the present invention and a precursor thereof, and an adhesive film derived from the adhesive composition precursor of the present invention will be described in more detail hereinafter.

Adhesive Composition

The resin component contained in the adhesive composition of the present invention is normally composed of the following components:

(a) a phenoxy resin,
(b) a non-brominated epoxy resin,
(c) a brominated epoxy resin, and
(d) dicyandiamide.

The respective components can be described as follows.

(a) The phenoxy resin is one of the components that contributes to the improvement of the adhesive force of the adhesive composition. For example, an intermolecular attraction force between hydroxyl groups of a polymer molecule constituting the phenoxy resin and the adhered surface and pliability (flexibility) of the resin itself contribute to the improvement of the peel adhesive force. It is suitable that the kind and addition amount of the phenoxy resin are selected so that the glass transition temperature of the cured composition does not become 70° C. or less. Consequently, the dynamic bending resistance of the cured composition is enhanced, thereby making it possible to effectively prevent breakage or peeling of the adhesive layer in use.

(b) The non-brominated epoxy resin operates by increasing the glass transition temperature of the cured composition by reaction with the curing agent, such as dicyandiamide. A relatively high glass transition temperature is advantageous for enhancing heat resistance of the composition. It is preferred that the kind and addition amount of the non-brominated resin are selected so that the glass transition temperature of the cured composition does not become 70° C. or less. As the non-brominated epoxy resin, for example, there can be used epoxy resins such as bisphenol A type, bisphenol F type, cresylic novolak type, phenolic novolak type, etc. When using brominated epoxy resin, non-brominated epoxy resin is not an essential component. However, it is preferable that both types of epoxy resins are contained to effectively enhance both adhesive force and nonflammability of the composition.

(c) The brominated epoxy resin enhances nonflammability of the compositions as described above. It also operates by enhancing solubility of the phenoxy resin in a specific solvent (e.g. mixed solvent containing methyl ethyl ketone and methanol, etc.). A mixed solvent of methyl ethyl ketone and methanol has a comparatively large evaporation rate. Accordingly, it is preferable to use brominated epoxy resin and phenoxy resin in combination so as to reduce the amount of the residual solvent in the adhesive composition after drying (e.g. adhesive film, etc.) and to realize a uniform structure of the respective components. In addition, brominated epoxy resin also has the same operation as that of the non-brominated epoxy resin with respect to its reaction with the curing agent. It is suitable that the kind and addition amount of the brominated resin are selected so that a good balance between nonflammability of the composition, solubility of the phenoxy resin, and glass transition temperature (exceeding 70° C.) of the composition after curing can be obtained. As the brominated epoxy resin, for example, there can be used those resins obtained by brominating a bisphenol A type epoxy resin.

(d) The polyol is as described above.

(e) It is preferred that the kind and addition amount of dicyandiamide are selected in the same manner as that in case of the above other resin component.

In addition, the resin component can contain the other additional component, in addition to the above components (a) to (e). It is preferred that the amount of such an additional component is selected in the same manner as that in case of the above other resin component.

Adhesive Composition Precursor

The adhesive composition precursor is a raw material of an adhesive composition, capable of affording an adhesive composition of the present invention after drying. This precursor is normally composed of the above resin component, particles of an inorganic colloid (e.g. a colloid of antimony pentaoxide, etc.) and a solvent.

The inorganic colloid is normally mixed with the above other component in the form of a sol, and then uniformly dispersed in a vehicle of the above resin component and solvent. A sol, such as those obtained by dispersing colloidal particles in an organic solvent, is normally used. It is preferred that the solvent used in the sol is selected taking the solubility in the above resin component therein into consideration. Among solvents, methyl ethyl ketone is preferred because its solubility in the above resin component is typically good and dispersion stability of the sol in the precursor (particles) is not likely to be deteriorated. The concentration of the inorganic colloid in the precursor composition is normally within the range from 1 to 50% by weight.

The adhesive composition precursor can be prepared according to various procedures. One preferred preparation method will be described by way of the example of using a colloid of antimony pentaoxide as the inorganic colloid.

First, the resin component is mixed with a solvent to prepare a uniform resin solution. Examples of a suitable mixing means include using a high-speed mixer, a planetary mixer, a homomixer, a sand mill, etc. The concentration of the resin solution is normally within the range from 5 to 70% by weight.

To the resin solution, prepared as described above, an antimony pentaoxide sol is added to prepare a uniform dispersion using a mixing means, thereby obtaining an adhesive composition precursor composed of the dispersion. According to such a method, there can be easily prepared a precursor containing antimony pentaoxide particles dispersed in the above resin component, uniformly and stably. In case of mixing the resin solution with the antimony pentaoxide sol, the same mixing means as described above can also be used.

As for the solvent, a mixed solvent containing methyl ethyl ketone is suitable as described above. In this case, the weight ratio (MeOH/MEK) of methyl ethyl ketone (MK) to methanol (MeOH) is normally within the range from 0.005 to 0.4. When the ratio (MeOH/MEK) is less than 0.005, the solubility of dicyandiamide is lowered. On the other hand, when it exceeds 0.4, the solubility of the phenoxy resin is lowered and, at the same time, uniform mixing of the respective components is likely to become difficult.

The mixed solvent may contain solvents other than methyl ethyl ketone and methanol. For example, alcohols such as ethanol, isopropyl alcohol, n-propyl alcohol, n-butyl alcohol, sec-butyl alcohol, t-butyl alcohol, etc. and nitrogen-containing solvents such as acetonitrile, etc. can be used. Among them, ethanol has good solubility in dicyandiamide and its evaporation rate is lower than that of methyl ethyl ketone. Thus, its use does not reduce the evaporation rate of the mixed solvent drastically. Therefore, uniformity of the coated film can be effectively improved without decreasing the drying rate of the coated film.

The adhesive composition precursor can contain various additives as far as the effect of the present invention is not adversely affected. Examples of suitable additives include surfactants, viscosity adjustors, etc.

Adhesive Film

The adhesive composition of the present invention can be used, for example, in the form of an adhesive film. In this case, the thickness of the adhesive film is not specifically limited, but is normally within the range from 5 µm to 1,000 µm.

The adhesive film can be produced by coating the adhesive composition precursor of the present invention on a substrate, followed by drying. As a coating means, the same means as that in case of a normal adhesive film can be used. Examples of suitable coating means include, for example, those using a knife coater, bar coater, die coater, etc. The drying conditions are not specifically limited, but are preferably a heating temperature of 50° C. to 120° C. with a heating time of several minutes to one hour so that residual solvent does not remain and curing of the composition does not proceed during the drying.

As the substrate, there can be used plastic films, such as polyimide films, polyester films, etc.; and metal foils, such as copper foils, aluminum foils, etc. In this case, as an adhesive sheet (tape) comprising a layer of an adhesive film and a substrate is normally used. Using a release film as the substrate, the adhesive film alone can be used after removing the release for use.

After layering the adhesive film on the adherend, the bonding can be completed by using a heat bonding operation including heating at 100° C. to 180° C. for 1 to 2 minutes and pressurizing at 2 to 50 kg/cm$^2$. After bonding, the heating operation can be subsequently performed at 150° C. to 170° C. for 1 to 5 hours. It is preferred that thickness of the adhesive film or composition of the adhesive composition is appropriately adjusted so that the composition component hardly flows out from the film end surface during the heat bonding operation.

It is preferred that the formulation of the adhesive composition is adjusted so that the tensile storage modulus at 60° C. of the cured adhesive film is $1 \times 10^{10}$ dyne/cm$^2$.

Therefore, dynamic bending resistance at 60° C. is relatively high and it is suitable as an adhesive for FPC protective film, which is repeatedly bent. As an adhesive for FPC protective film, it is preferable to adjust the shrinkage factor of the adhesive film after the completion of curing to 0.1% or less. The term "shrinkage factor of a film" used herein means a percentage of a ratio of the reduction in size after heat bonding (after curing) to the size before heat bonding (before curing).

EXAMPLES

The present invention will be described in more detail with reference to the following examples. It will be appreciated that the present invention is not limited by the following examples.

Example 1

(1) Preparation of Adhesive Composition Precursor (Dispersion) and Formation of Adhesive Film First, 60.0 of a phenoxy resin (trade name: YP50S, having a number-average molecular weight of 1.180, a weight-average molecular weight of 58,600, and manufactured by Tohto Chemical Co., Ltd.), 20.0 g of a polyester polyol-containing phenoxy resin (trade name: PKHM-30, containing about 30% by weight of a polyester polyol, and manufactured by Union Carbide Co.), 10.0 g of a bisphenol A type epoxy resin (trade name: DER332, epoxy equivalent: 173, and manufactured by Dow Co.), 10.0 g of a brominated epoxy resin (trade name: YDB400, epoxy equivalent: 400, and manufactured by Tohto Chemical Co., Ltd.), and 1.74 g of dicyandiamide (Dicy) (trade name: Amicure CG1200, having an amine equivalent of 21, and manufactured by ACR Co.) were dissolved in a mixed solvent of 225 g of methyl ethyl ketone and 43.5 g of methanol to obtain an uniform solution.

To the solution thus obtained, 20.0 of an antimony pentaoxide sol (trade name: SUNCOLLOID AME-130, particle diameter: 5 to 50 nm, concentration of solid content: 30% by weight, dispersion medium: methyl ethyl ketone, manufactured by Nissan Chemical Industries Co., Ltd.) was added. An adhesive composition precursor of a uniform dispersion of this example was obtained. The composition of the adhesive composition precursor thus obtained is shown in Table 1.

Subsequently, in order to form an adhesive film, the resulting dispersion was uniformly coated on a polyimide film (trade name: KAPTON V, thickness: 25 µm,) and then dried at 90° C. for 30 minutes. As a result, an adhesive film (thickness: 30 µm) of the desired adhesive composition was obtained on the polyimide film.

(2) Evaluation of Characteristics of Adhesive Film

Characteristics of the resulting film were evaluated with respect to the following evaluation items A to E in accordance with the described procedures.

A. Evaluation of Dimensional Stability

A rectangular surface of about 70 mm×35 mm was drawn on the polyimide side of an adhesive film laminated with a polyimide film by using a cutter knife. The length of each side was measured. Then, a KAPTON V film, having a thickness of 25 µm, was layered on the adhesive surface of the adhesive film, heat-bonded at 180° C. under a pressure of 10 kg/cm$^2$ for 1 minute, and then allowed to stand at room temperature for 1 hour. Subsequently, the adhesive film after heat bonding was heat-treated at 150° C. for 4 hours and further allowed to stand at room temperature for 1 hour.

In this example, evaluation of the dimensional stability was performed with respect to the dimensional change (%) and timing of the evaluation was as follows: First time: the evaluation was performed after heat bonding at 120° C. for 1 minute and following standing at room temperature (see data of the item ① in Table 2), and Second time: the evaluation was performed after heat bonding at 180° C. for 1 minute and following standing at room temperature, a heat treatment at 150° C. for 4 hours and standing at room temperature (see data of the item ② in Table 2). The evaluation results described in Table 2 were obtained.

Giving a supplementary explanation with respect to the results described in the following Table 2, the length of each side of the rectangular shape was measured after heat bonding and heat treatment, respectively, and then a ratio (%) of a change (reduction) in length to the length before heat bonding or heat treatment was taken as the dimensional change (%). A minus (−) dimensional change (%) indicates that shrinkage arose after heat bonding or heat treatment.

B. Evaluation of Nonflammability

The adhesive film was peeled off from the adhesive film laminated with a polyimide film. Then, a nonflammability test was carried out by the method according to the standard UL94 to evaluate whether the tested adhesive film satisfied the standard VO or not. The evaluation results described in the following Table 2 were obtained. In this evaluation test, the case of satisfying the level VO was judged as "Pass" and the case of less than the level VO was judged as "NG".

C. Evaluation of Adhesive Force

A rolled copper foil having a thickness of 30 μm was layered on the adhesive surface of the adhesive film laminated with a polyimide film, heat-bonded at 180° C. under a pressure of 20 kg/cm² for 1 minute, and then heat-treated at 150° C. for 4 hours. In the resulting sample, the copper foil layered on the adhesive film was peeled off at a peel angle of 180° and a peel rate of 50 mm/minute. An integrated average value of the resulting values was taken as a measure of the adhesive force (peel adhesive force, g/cm). The evaluation results described in Table 2 were obtained.

D. Measurement of Viscoelasticity

In order to form an adhesive film with a PET film, a dispersion of the adhesive composition precursor prepared in the above step (1) was coated on a PET film subjected to a peeling treatment and then dried. The adhesive film was peeled from the PET film and the single adhesive film was sandwiched between release papers. The resulting laminate was heat-bonded at 180° C. under a pressure of 20 kg/cm² for 1 minute and heat-treated at 150° C. for 4 hours to cure the adhesive film. Finally, this cured adhesive film was removed from the laminate and the single adhesive film was taken as a measuring sample. The elasticity, i.e. tensile storage elasticity (dyne/cm²) of the resulting sample was measured using a dynamic viscoelasticity measuring apparatus, Model: RSAII, manufactured by Rheometric Co. The measuring temperature was 60° C. and the measuring frequency was 1 Hz. The evaluation results described in Table 2 were obtained.

E. Measurement of Glass Transition Temperature (Tg)

The glass transition temperature of the resulting adhesive film was measured and is described in Table 2. The Tg was determined based on the tan δ value obtained in the above-described determination of viscoelasticity.

Examples 2 to 4

According to the same manner as described in Example 1 except for changing the kind and content of each resin component as described in Table 1, an adhesive composition precursor and an adhesive film (adhesive composition) of each example were prepared. The content of dicyandiamide (Dicy) was adjusted so that the epoxy equivalent of the total epoxy resins was the same as the active hydrogen equivalent of Dicy. The resin component PKMH-301 described in Table 1 is a polyester polyol-containing phenoxy resin (containing about 30% by weight of a polyester polyol, manufactured by Union Carbide Co., Ltd. and sold under the trade designation PKMH-301).

According to the same manner as that described in Example 1, the characteristics of each adhesive film were evaluated and are described in Table 2.

Comparative Example 1

According to the same manner as that described in Example 1 except for changing the kind and content of each resin component as described in Table 1 (provided that polyester polyol PKHM-30 was not contained for comparison), an adhesive composition precursor and an adhesive film of this example were prepared. According to the same manner as that described in Example 1, the characteristics of the adhesive film were evaluated and are described in Table 2.

As is apparent from the results described in Table 2, the dimensional change (%) of this example was large (−0.12%) after a heat treatment at 150° C. for 4 hours and following standing at room temperature (see data of item ② in the table) in comparison with Examples 1 to 4. In this example, the peel adhesive force was 570 g/cm and did not reach the desired value of 700 g/cm.

Comparative Example 2

According to the same manner as that described in Example 1, except for using no antimony pentaoxide sol (AME-130), an adhesive composition precursor and an adhesive film of this example were prepared. According to the same manner as that described in Example 1, the characteristics of the adhesive film were evaluated and are described in Table 2.

As is apparent from the results described in Table 2, the dimensional change (%) of this example was large (−0.12%) after a heat treatment at 150° C. for 4 hours and following standing at room temperature (see data of item ② in the table) in comparison with Examples 1 to 4.

TABLE 1

|         | Example 1 | Example 2 | Example 3 | Example 4 | Comp. Example 1 | Comp. Example 2 |
|---------|-----------|-----------|-----------|-----------|-----------------|-----------------|
| YP50S   | 60.0      | 55.0      | 60.0      | 50.0      | 70.0            | 60.0            |
| PKHM-30 | 20.0      | 25.0      | —         | —         | —               | 20.0            |
| PKHM-301| —         | —         | 20.0      | 30.0      | —               | —               |
| DER332  | 10.0      | 10.0      | 10.0      | 10.0      | 20.0            | 10.0            |
| YDB400  | 10.0      | 10.0      | 10.0      | 10.0      | 10.0            | 10.0            |
| Dicy    | 1.74      | 1.74      | 1.74      | 1.74      | 2.95            | 1.74            |
| AME-130 | 20.0      | 20.0      | 20.0      | 20.0      | 20.0            | —               |

TABLE 2

|  | Example 1 | Example 2 | Example 3 | Example 4 | Comp. Example 1 | Comp. Example 2 |
|---|---|---|---|---|---|---|
| Dimensional[1] change (%) | −0.04 | — | — | — | −0.02 | — |
| Dimensional[2] change (%) | −0.04 | −0.05 | −0.09 | −0.08 | −0.12 | −0.10 |
| Nonflammability (V0) | Pass | Pass | Pass | Pass | Pass | NG |
| Adhesive force (g/cm) | 780 | 776 | 819 | 818 | 570 | — |
| Elasticity (60° C.) (dyne/cm$^2$) | $1.5 \times 10^{10}$ | $1.3 \times 10^{10}$ | $1.4 \times 10^{10}$ | $1.3 \times 10^{10}$ | $1.5 \times 10^{10}$ | $1.5 \times 10^{10}$ |
| Tg (° C.) | 85 | 79 | 84 | 74 | 105 | 84 |

Example 5

(1) Preparation of Adhesive Composition Precursor (Dispersion) and Formation of Adhesive Film According to the same manner as that described in Example 1 except for changing the kind and content of each resin component as described in Table 3 and also changing the solvent, an adhesive composition precursor and an adhesive film (adhesive composition) of this example were prepared. That is, in case of this example, a polyester polyol resin (trade name: PLACCEL 205 number-average molecular weight: 1,000, manufactured by Daiseru Chemical Industries Co., Ltd.) was used in place of the polyester polyol-containing phenoxy resin (PKHM-30), and a mixed solvent of 100 g of methyl ethyl ketone, 10.0 g of ethanol and 35.0 g of methanol was used as the solvent in place of the mixed solvent of 225 g of methyl ethyl ketone and 43.5 g of methanol.

(2) Evaluation of Characteristics of Adhesive Film

The dimensional stability of the resulting adhesive film laminated with a polyimide film was evaluated in the same manner as that described in Example 1 and are described in Table 4. The conditions of heat bonding and heat treatment were changed as follows:

First time: Films were heat-bonded at 120° C. under a pressure of 10 kg/cm$^2$ for 2 minutes and then allowed to stand at room temperature for 1 hour (see data of item (1) in the table).

Second time: Films were heat-bonded at 120° C. under a pressure of 10 kg/cm$^2$ for 2 minutes and then allowed to stand at room temperature for 1 hour. Subsequently, the resulting adhesive film was heat-treated at 170° C. for 2 minutes and then allowed to stand at room temperature for 1 hour (see data of item (Z in the table).

Subsequently, dimensional stability, nonflammability, adhesive force, viscoelasticity and glass transition temperature of the adhesive film were evaluated in the same manner as that described in Example 1 and are described in Table 4. The conditions of heat bonding and heat treatment were changed in the same manner as in the above evaluation of the dimensional stability.

Examples 6 to 8

The procedure described in Example 5 was repeated. However, in this example, the same amounts, but different resins, were used instead of the polyester polyol resin PLACCEL 205.

Example 6: a polyester polyol resin (trade name: PLACCEL 210, number-average molecular weight: 1,000, manufactured by Daiseru Chemical Industries Co., Ltd.), Example 7: a polyester polyol resin (trade name: PLACCEL 240, number-average molecular weight: 4,000, manufactured by Daiseru Chemical Industries Co., Ltd.), and Example 8: a polyester polyol resin (trade name: PLACCEL TP249, number-average molecular weight: 16,000, manufactured by Daiseru Chemical Industries Co., Ltd.).

Subsequently, dimensional stability, nonflammability, adhesive force, viscoelasticity and glass transition temperature of the adhesive film were evaluated in the same manner as that described in Example 5 and are described in Table 4.

TABLE 3

|  | Example 5 | Example 6 | Example 7 | Example 8 |
|---|---|---|---|---|
| YP50S | 64.0 | 64.0 | 64.0 | 64.0 |
| PLACCEL 205 | 6.0 | — | — | — |
| PLACCEL 210 | — | 6.0 | — | — |
| PLACCEL 240 | — | — | 6.0 | — |
| TP249 | — | — | — | 6.0 |
| YD128 | 15.0 | 15.0 | 15.0 | 15.0 |
| YDB400 | 15.0 | 15.0 | 15.0 | 15.0 |
| Dicy | 1.50 | 1.50 | 1.50 | 1.50 |
| AME-130 | 20.0 | 20.0 | 20.0 | 20.0 |

TABLE 4

|  | Example 5 | Example 6 | Example 7 | Example 8 |
|---|---|---|---|---|
| Dimensional[1] Change (%) | −0.03 | −0.02 | −0.02 | −0.01 |
| Dimensional[2] Change (%) | −0.07 | −0.06 | −0.07 | −0.05 |
| Nonflammability (V0) | Pass | Pass | Pass | Pass |
| Adhesive force (g/cm) | 926 | 1025 | 1136 | 897 |
| Elasticity (60° C.) (dyne/cm$^2$) | $1.0 \times 10^{10}$ | $1.0 \times 10^{10}$ | $1.0 \times 10^{10}$ | $1.6 \times 10^{10}$ |
| Tg (° C.) | 74 | 74 | 74 | 84 |

As described above, according to the present invention, the dimensional stability and adhesion can be simultaneously improved, particularly, in an adhesive composition comprising a resin component containing a phenoxy resin, an epoxy resin and a curing agent. Accordingly, the resulting adhesive composition can be advantageously utilized as an adhesive or FPC protective film. According to the present invention, there can also be provided a precursor capable of deriving such an adhesive composition.

What is claimed is:

1. An adhesive composition comprising:
   a resin component comprising
      a phenoxy resin
      an epoxy resin, and
      a curing agent;
   a polyester polyol; and
   an inorganic colloid dispersed in the resin component.

2. The adhesive composition according to claim 1, wherein the epoxy resin contains a brominated epoxy resin.

3. The adhesive composition according to claim 1, wherein the inorganic colloid is a colloid of antimony pentaoxide.

4. The adhesive composition according to claim 3, wherein the inorganic colloid is a colloid of antimony pentaoxide.

5. The adhesive composition according to claim 4, wherein the total proportion of the brominated epoxy resin and the colloid of antimony pentaoxide is within the range of about 13 to about 60% by weight based on total amount of the adhesive composition.

6. The adhesive composition according to claim 1, wherein the polyester polyol comprises about 0.5% to about 20% by weight of the total adhesive composition.

7. The adhesive composition according to claim 1, wherein the adhesive composition has a glass transition temperature of about 70° C. or greater.

8. The adhesive composition according to claim 1, wherein the inorganic colloid comprises about 1% to about 50% by weight of the total adhesive composition.

9. The adhesive composition according to claim 1, wherein the curing agent comprises a dicyandiamide or derivative thereof.

10. The adhesive composition according to claim 1, further comprising a non-brominated epoxy resin.

11. An adhesive composition comprising:
    a resin component comprising:
       a phenoxy resin,
       a non-brominated epoxy resin,
       a brominated epoxy resin, and
       a dicyandiamide; and
    a polyester polyol; and
    an inorganic colloid dispersed in the resin component.

12. The adhesive composition of claim 11, wherein the phenoxy resin comprises about 40% to about 95% by weight of the resin component.

13. The adhesive composition of claim 11, wherein the non-brominated epoxy resin comprises about 4% to about 40% by weight of the resin component.

14. The adhesive composition of claim 11, wherein the brominated epoxy resin comprises about 4% to about 50% by weight of the resin component.

15. The adhesive composition of claim 11, wherein the dicyandiamide comprises about 0.1% to about 7% by weight of the resin component.

16. An adhesive composition comprising:
    a resin component comprising:
       about 50% to about 90% by weight phenoxy resin,
       about 5% to about 35% by weight non-brominated epoxy resin,
       about 5% to about 40% by weight brominated epoxy resin, and
       about 0.5% to about 5% by weight dicyandiamide, based on total weight of the resin component;
    a polyester polyol; and
    an inorganic colloid dispersed in the resin component.

17. An adhesive composition precursor capable of affording the adhesive composition of claim 1 after drying, wherein the precursor comprises:
    (i) the resin component, and
    (ii) an inorganic particle sol containing a dispersion medium and the inorganic colloid dispersed in the dispersion medium.

18. A protective film for use in a flexible printed circuit board comprising:
    a resin component comprising:
       a phenoxy resin,
       an epoxy resin, and
       a curing agent;
    a polyester polyol; and
    an inorganic colloid dispersed in the resin component.

19. A flexible printed circuit board assembly comprising:
    a flexible printed circuit board, and
    the protective film of claim 18.

* * * * *

UNITED STATES PATENT AND TRADEMARK OFFICE
CERTIFICATE OF CORRECTION

PATENT NO. : 6,228,500 B1
DATED : May 8, 2001
INVENTOR(S) : Yuji Hiroshige and Kohichiro Kawate It is certified that error appears in the above-identified patent and that said Letters Patent is hereby corrected as shown below:

Column 6,
Line 50, "methyl ethyl ketone (MK) to" should be -- methyl ethyl ketone (MEK) to --.

Column 7,
Line 64, "First, 60.0 of a phenoxy resin" should be -- First, 60.0 g of a phenoxy resin --.

Column 8,
Line 13, "To the solution thus obtained, 20.0 of an" should be -- To the solution thus obtained, 20.0 g of an --.

Column 11,
Line 51, "(see data of item (Z in the table)." should be -- (see data in item ②in the table). --

Signed and Sealed this

Eighth Day of January, 2002

*Attest:*

JAMES E. ROGAN
*Attesting Officer*  *Director of the United States Patent and Trademark Office*